(12) United States Patent  
Kominami et al.

(10) Patent No.: US 9,113,561 B2  
(45) Date of Patent: Aug. 18, 2015

(54) CASE AND ELECTRONIC DEVICE

(71) Applicant: FUJITSU LIMITED, Kawasaki-shi, Kanagawa (JP)

(72) Inventors: Takanao Kominami, Kawasaki (JP); Kaigo Tanaka, Kawasaki (JP); Masahiko Hoshi, Katsushika (JP)

(73) Assignee: FUJITSU LIMITED, Kawasaki (JP)

( * ) Notice: Subject to any disclaimer, the term of this patent is extended or adjusted under 35 U.S.C. 154(b) by 110 days.

(21) Appl. No.: 13/903,439

(22) Filed: May 28, 2013

(65) Prior Publication Data

US 2014/0036422 A1 Feb. 6, 2014

(30) Foreign Application Priority Data

Jul. 31, 2012 (JP) ................................. 2012-170534

(51) Int. Cl.
*G06F 1/16* (2006.01)
*H05K 5/03* (2006.01)

(52) U.S. Cl.
CPC .............. *H05K 5/03* (2013.01); *G06F 1/1615* (2013.01); *G06F 1/1656* (2013.01)

(58) Field of Classification Search
CPC .................................................. H05K 5/0013
See application file for complete search history.

(56) References Cited

U.S. PATENT DOCUMENTS

| 4,673,100 | A | * | 6/1987 | Reis et al. ...................... 220/324 |
| 5,634,675 | A | * | 6/1997 | Mo .................................. 292/80 |
| 5,808,863 | A | * | 9/1998 | Radloff et al. ............ 361/679.58 |
| 6,394,300 | B1 | * | 5/2002 | Bosy .............................. 220/326 |
| 7,121,637 | B2 | * | 10/2006 | Fang .......................... 312/223.2 |
| 8,424,927 | B2 | * | 4/2013 | Tsai ................................ 292/80 |

FOREIGN PATENT DOCUMENTS

| JP | 58-184878 | 12/1983 |
| JP | 2002-216728 | 8/2002 |

* cited by examiner

*Primary Examiner* — Anthony Q Edwards
(74) *Attorney, Agent, or Firm* — Fujitsu Patent Center

(57) ABSTRACT

A case including a casing body formed with an opening and a cover attached to the opening to be capable of opening and closing. The case further including a first grip tab that extends from the cover towards the opening inner side and a second grip tab that includes an anchor portion that anchors in the cover opening direction to an anchored-to portion provided to the casing body. The second grip tab disposed facing towards the first grip tab and resiliently supported by the first grip tab to be capable of approaching and moving away from the first grip tab such that an insertion portion opened in the opening direction is formed between the first grip tab and the second grip tab and such that an anchored state of the anchor portion to the anchored-to portion is released by the second grip tab moving away from the first grip tab.

15 Claims, 9 Drawing Sheets

CASE AND ELECTRONIC DEVICE

CROSS-REFERENCE TO RELATED APPLICATION

This application is based upon and claims the benefit of priority of the prior Japanese Patent Application No. 2012-170534, filed on Jul. 31, 2012, the entire contents of which are incorporated herein by reference.

FIELD

The embodiments discussed herein are related to a case and to a electronic device.

BACKGROUND

An electronic device is known that is equipped with a case formed with an opening for attaching and detaching an electronic component, and with a cover that is slidably attached to the opening of the case and is formed with a claw that anchors to the case.

In such electronic devices, an electronic device is known in which an anchored state of the claw to the case is released by inserting a tool into a lock release hole formed at an outer peripheral portion of the opening and pressing the claw with the tool.

RELATED PATENT DOCUMENTS

Japanese Laid-Open Patent Publication No. 2002-216728
Japanese Laid-Open Utility Model Publication No. 1983-184878 (Japanese Examined Utility Model Application Publication No. 01-009180)

SUMMARY

According to an aspect of the embodiments, a case including: a casing body formed with an opening; a cover attached to the opening so as to be capable of opening and closing; a first grip tab that extends out from the cover towards the opening inner side; and a second grip tab that includes an anchor portion that anchors in the cover opening irection to an anchored-to portion provided to the casing body, the second grip tab disposed facing towards the first grip tab and resiliently supported by the first grip tab so as to be capable of approaching towards and moving away from the first grip tab such that an insertion portion opened in the opening opening direction is formed between the first grip tab and the second grip tab and such that an anchored state of the anchor portion to the anchored-to portion is released by the second grip tab moving away from the first grip tab.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Explanation follows regarding an exemplary embodiment of an electronic device disclosed herein, with reference to the drawings.

Figure 1:
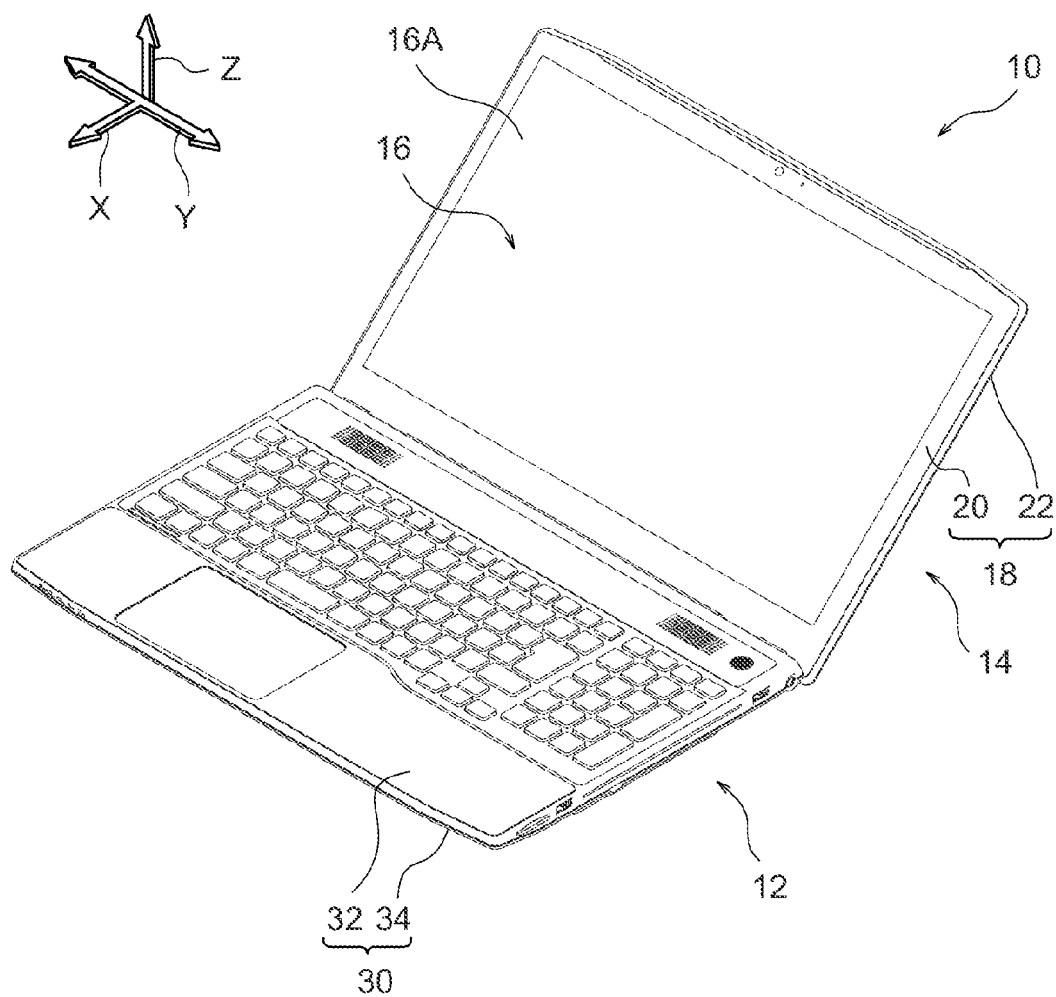
FIG. 1 is a perspective view illustrating a notebook PC according to an exemplary embodiment.

As illustrated in FIG. 1, a notebook style personal computer (referred to below as a notebook PC) 10 serving as an example of an electronic device is provided with a fixed side device 12 and a moveable side device 14. The moveable side device 14 is supported at a rear edge portion of the fixed side device 12 through a hinge unit, not illustrated in the drawings, so as to be capable of opening and closing (swinging).

The moveable side device 14 includes a display panel 16 and a moveable side casing 18 that houses the display panel 16. The front face of the display panel 16 configures a display face 16A that displays for example images and video.

The moveable side casing 18 includes a front cover 20 that covers an outer peripheral portion of the display face 16A of the display panel 16, and a back cover 22 that covers the back face of the display panel 16. The front cover 20 is formed in a frame shape, with the display face 16A of the display panel 16 exposed from the inside the front cover 20.

The fixed side device 12 includes a fixed side casing 30 serving as an example of a casing body. Note that, as appropriately indicated in each of the drawings, in the following explanation an arrow X direction is the front side of a front-rear direction of the fixed side casing 30 (casing front-rear direction) and an arrow Z direction is the upper side in an up-down direction of the fixed side casing 30 (casing up-down direction). An arrow Y direction is a width direction of the fixed side casing 30 (casing width direction).

The fixed side casing 30 houses a printed circuit board 28 (see FIG. 3) mounted with plural electronic components, and is formed in a thin box shape. The fixed side casing 30 is divided in the up-down direction into an upper case 32 and a lower case 34 pair. The upper case 32 and the lower case 34 are joined together with for example screws, not illustrated in the drawings.

Figure 2:
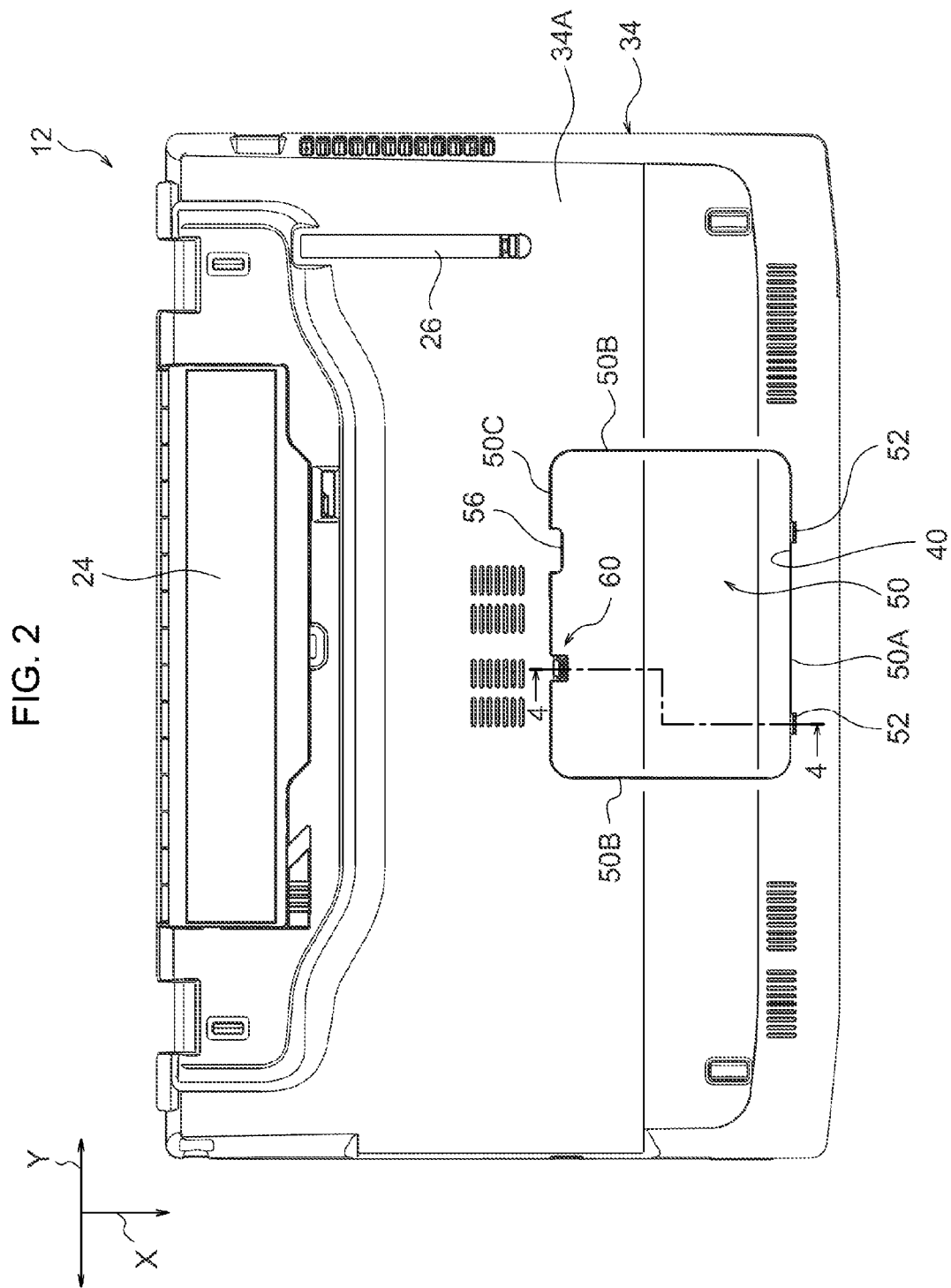
FIG. 2 is a plan view of a fixed side case of the notebook PC illustrated in FIG. 1, as viewed from below.

As illustrated in FIG. 2, a battery 24 is disposed at the rear side of a bottom wall portion 34A of the lower case 34. A cleaning opening, not illustrated in the drawings, for cleaning radiator fins configuring a cooling device are formed at one case width direction end side (the right hand side in FIG. 2) of the bottom wall portion 34A of the lower case 34. An openable and closable radiator fin cover 26 is attached to the cleaning opening.

Figure 3:
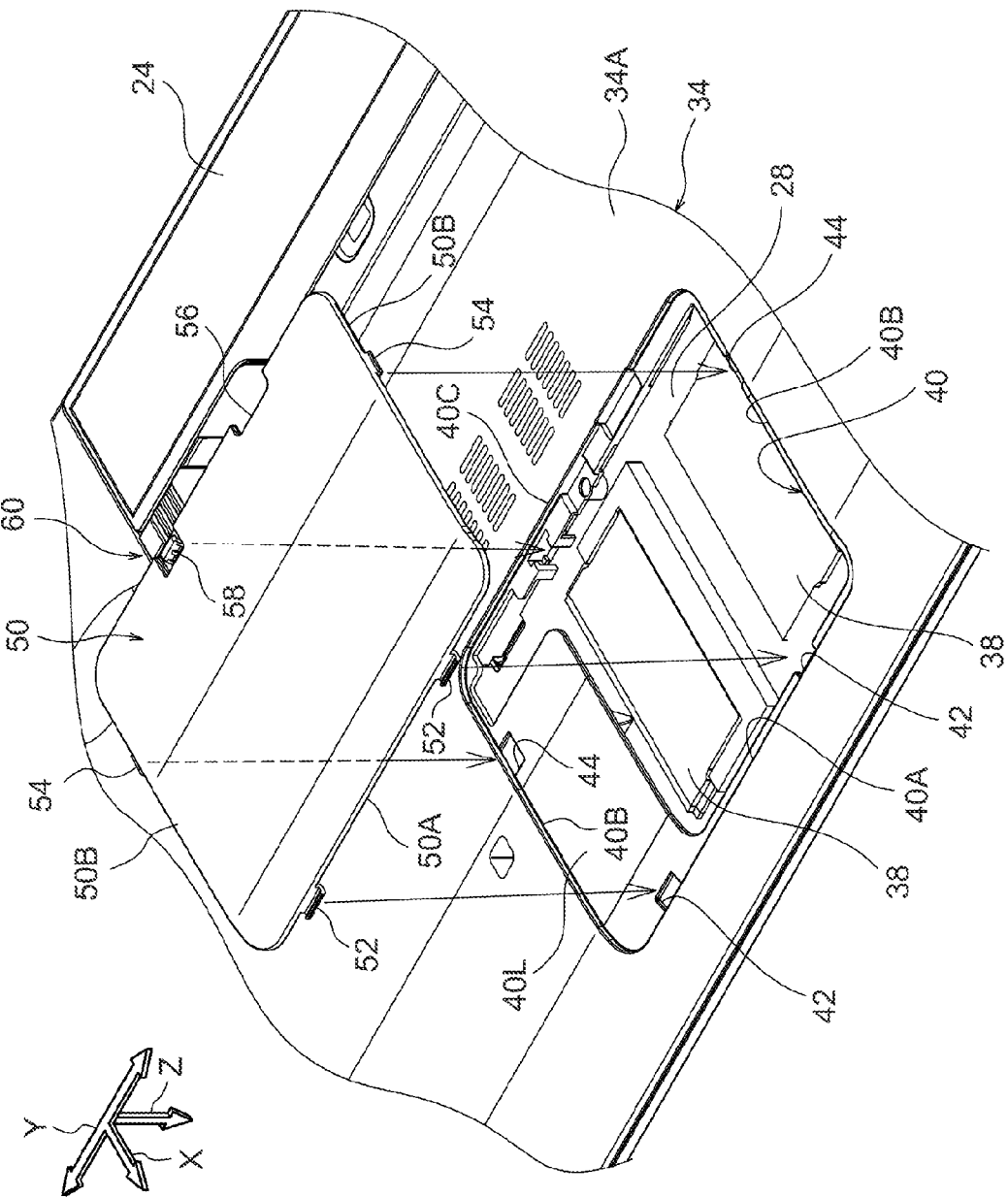
FIG. 3 is an exploded perspective view illustrating the fixed side case and a memory cover illustrated in FIG. 2.

As illustrated in FIG. 3, an opening 40 is formed at the front side of the bottom wall portion 34A of the lower case 34 for housing a memory card (main storage device) 38 that serves as an example of a storage device. The opening 40 is rectangular shaped and plural (two in the present exemplary embodiment) memory cards 38 are detachably mounted, through the opening 40, to the printed circuit board 28 housed in the fixed side casing 30.

A memory cover 50 that serves as an example of a cover is attached to the opening 40 so as to be capable of opening and closing. The memory cover 50 is formed from a resin in a rectangular shape. A case front-rear direction first end portion (front end portion) 50A of the memory cover 50 is attached to an opening portion 40A at a case front-rear direction first end side (front end side) of the opening 40 so as to enable opening and closing.

Specifically, a pair of hook portions 52 are provided to the first end portion 50A of the memory cover 50, separated from each other along the case width direction. Each of the hook portions 52 extends from the first end portion 50A of the memory cover 50, and is formed with a hooked shape so as to detachably hook inside the opening portion 40A that extends along the case width direction.

Figure 4:
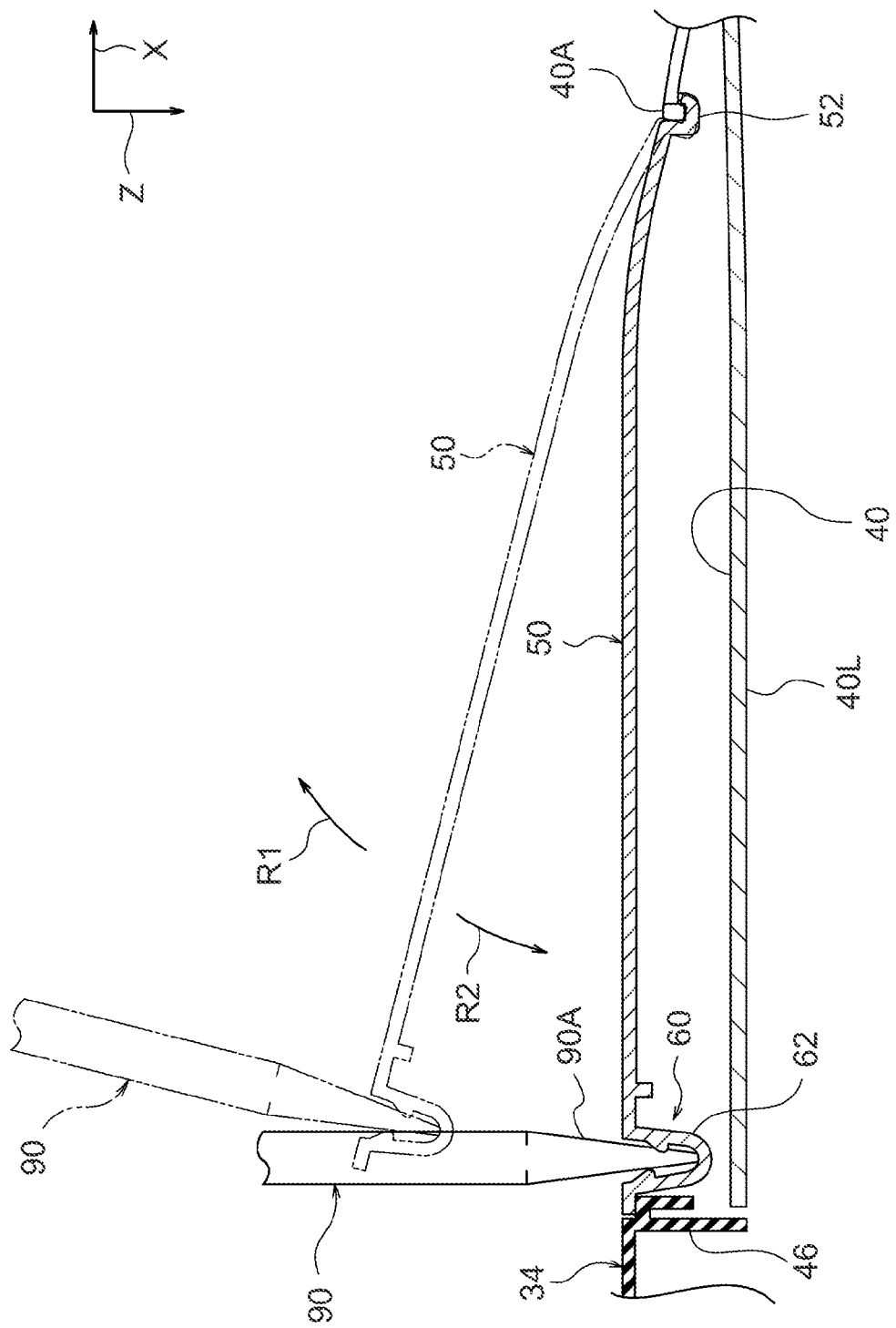
FIG. 4 is a cross-section taken on line 4-4 of FIG. 2.

A pair of cutout holes 42 are formed at the front end side of an opening bottom section 40L of the opening 40, and the pair of hook portions 52 are respectively inserted into the cutout holes 42. The first end portion 50A of the memory cover 50 is pivotally attached to the opening portion 40A by the pair of hook portions 52 hooking through the cutout holes 42 and onto the inside of the opening portion 40A. Namely, the memory cover 50 is pivotally attached to the opening portion 40A, with the opening portion 40A running along the first end portion 50A acting as a pivot axis. Consequently, as illustrated in FIG. 4, the memory cover 50 is capable of pivoting between a closed position (the position illustrated by solid lines) that closes off the opening 40, and an open position (the position illustrated by the double dot broken lines) that opens the opening 40. Note that arrow R1 in FIG. 4 indicates the opening direction of the memory cover 50, and the arrow R2 indicates the closing direction of the memory cover 50.

Moreover, as illustrated in FIG. 3, positioning projections 54 are provided to both case width direction end portions 50B of the memory cover 50 so as to respectively project out from the two end portions 50B towards the opening 40 inner side. When the memory cover 50 is positioned in the closed position closing the opening 40, the positioning projections 54 are inserted into respective positioning holes 44 formed on the two case width direction ends of the opening bottom section 40L, and engage with respective opening edge portions 40B at the two case width direction sides of the opening 40. The memory cover 50 is thereby positioned in the case width direction with respect to the opening 40.

Moreover, a catching groove 56 that an operator catches with for example a finger when opening the memory cover 50, and a lock mechanism 60 that retains the memory cover 50 in a state positioned in the closed position, are provided to the case front-rear direction other end portion 50C (rear end portion) of the memory cover 50.

Figure 5:
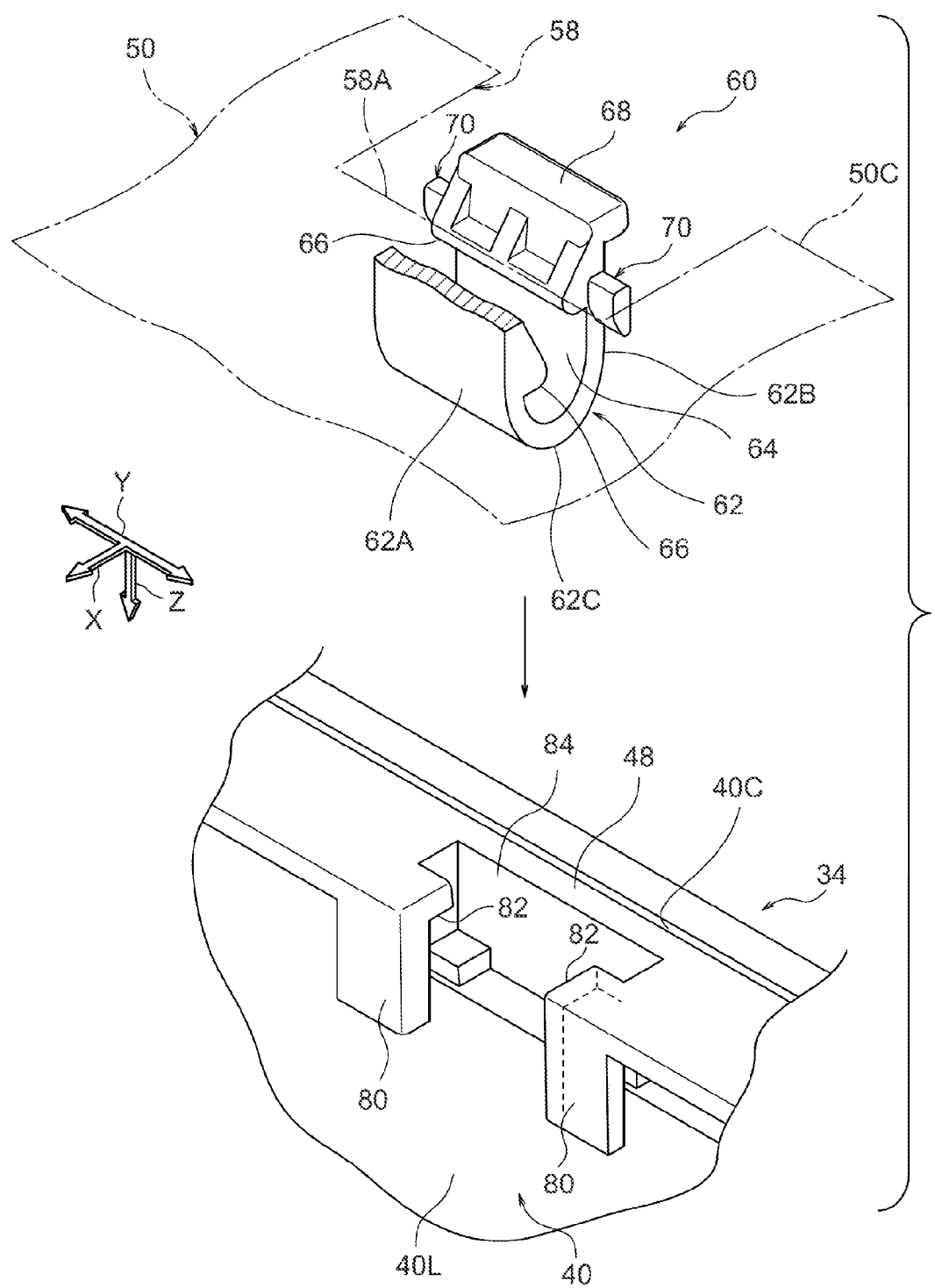
FIG. 5 is an enlarged perspective view of a portion of FIG. 3, illustrating a lock mechanism.

As illustrated in FIG. 5, the lock mechanism 60 is disposed in a rectangular shaped cutout 58 formed in the other end portion 50C of the memory cover 50. The lock mechanism 60 includes a grip portion 62 that grips a leading end portion 90A of a flat head screwdriver 90 (see FIG. 6A), described later. The grip portion 62 is formed with a U-shaped cross-section shape that configures a projection out from the memory cover 50 towards the opening 40 inner side, and includes a first grip tab 62A and a second grip tab 62B pair that mutually face each other, and a bottom wall portion 62C that connects together the first grip tab 62A and the second grip tab 62B.

The first grip tab 62A extends out from a front side edge portion 58A of the cutout 58 towards the inner side of the opening 40 (the opening bottom section 40L side). The second grip tab 62B is disposed on the opposite side with respect to the first grip tab 62A to the opening portion 40A (see FIG. 4) of the previously described memory cover 50 that acts as the pivot axis. In other words, the second grip tab 62B is disposed on the opposite side with respect to the first grip tab 62A to the memory cover 50 opening direction.

An insertion groove 64 serving as an example of an insertion portion that is open in the opening direction of the opening 40 (the opposite direction to the arrow Z direction) is formed between the first grip tab 62A and the second grip tab 62B. The second grip tab 62B is resiliently supported by the first grip tab 62A through the bottom wall portion 62C of the insertion groove 64 so as to be capable of approaching and moving away from the first grip tab 62A.

Figure 6A:
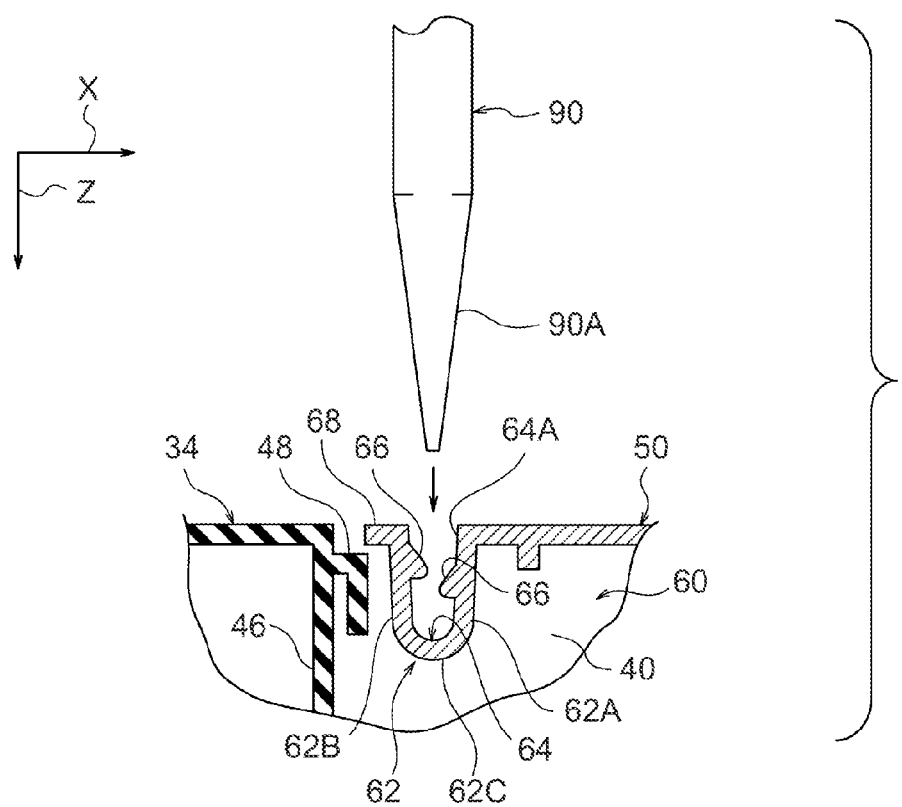
FIG. 6A is a cross-section taken on line 6A-6A of FIG. 8.
Figure 6B:
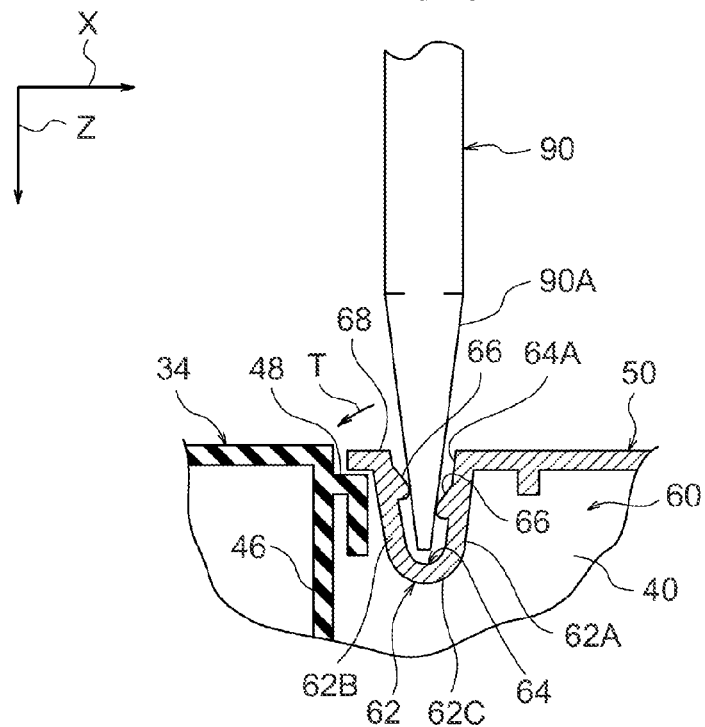
FIG. 6B is a cross-section corresponding to FIG. 6A and illustrating a deformed state of a second grip tab.

Moreover, as illustrated in FIG. 6A, a pair of projection portions 66 are respectively provided to the first grip tab 62A and the second grip tab 62B so as to project out into the insertion groove 64. As illustrated in FIG. 6B, the second grip tab 62B resiliently deforms in the direction to move away from the first grip tab 62A (the arrow T direction) when the leading end portion 90A of the flat head screwdriver 90 is inserted between the pair of projection portions 66. The leading end portion 90A of the flat head screwdriver 90 is also gripped from both sides between the pair of projection portions 66 due to the rebound force of the resiliently deformed second grip tab 62B.

Figure 7:
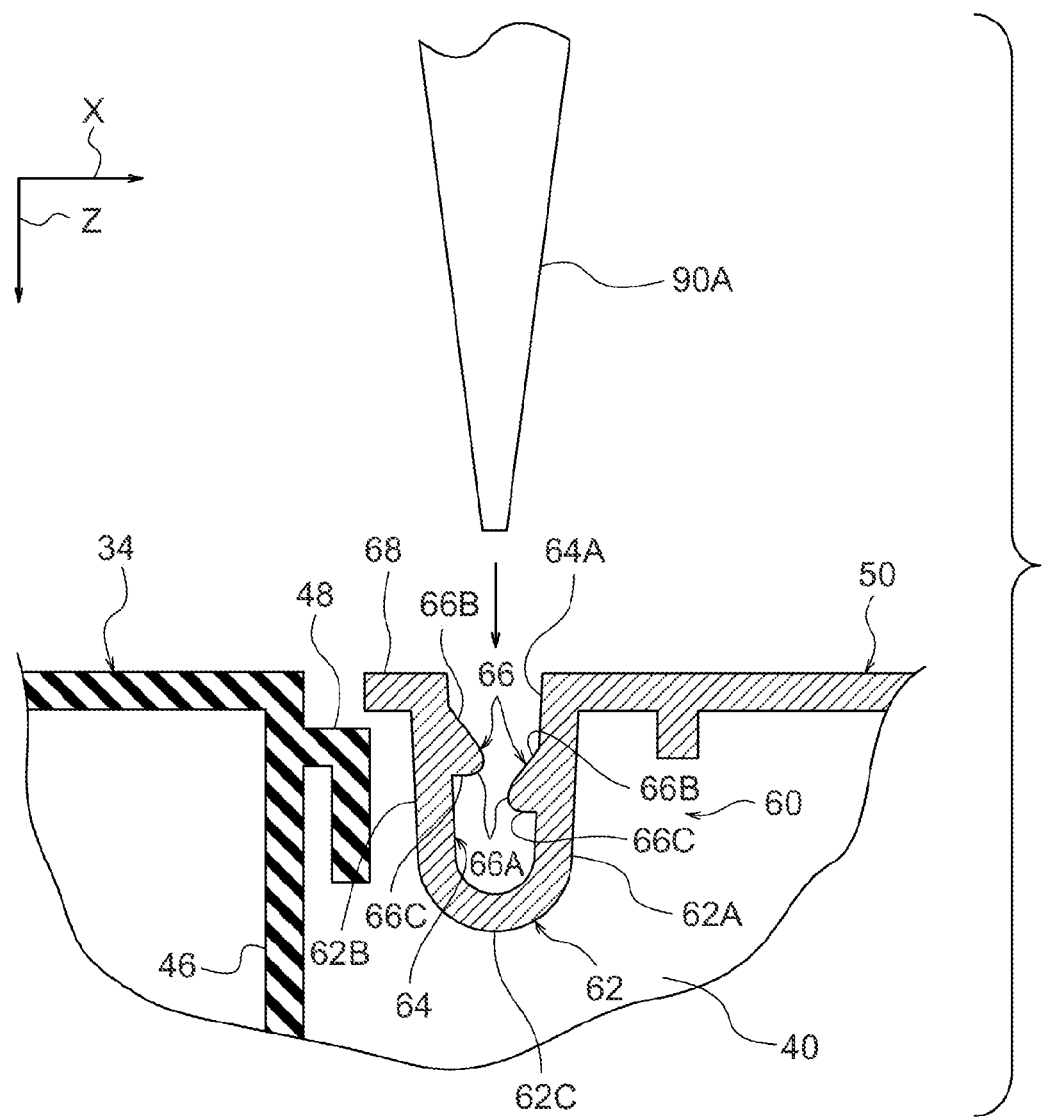
FIG. 7 is an enlarged view of a portion of FIG. 6A.

The pair of projection portions 66 are formed as illustrated in FIG. 7 with triangular shaped cross-sections. A sloping portion 66B is formed to an insertion groove 64 insertion opening 64A side of each of the projection portions 66, the sloping portions 66B sloping towards the opposite side to an insertion opening 64A (the opening bottom section 40L side) on progression towards a projection direction leading end portion 66A side. A configuration is thereby achieved in which the leading end portion 90A of the flat head screwdriver 90 is guided between the leading end portions 66A of the pair of projection portions 66 by the sloping portions 66B.

One of the projection portions 66 that projects out from the second grip tab 62B is positioned, with respect to the other of the projection portions 66 that projects out from the first grip tab 62A, on the insertion opening 64A side of the insertion groove 64. Consequently, a configuration is achieved in which a larger moment acts on the second grip tab 62B than on the first grip tab 62A when the leading end portion 90A of the flat head screwdriver 90 is inserted between the pair of projection portions 66. The second grip tab 62B is accordingly readily resiliently deformed in the direction to move away from the first grip tab 62A when the leading end portion 90A of the flat head screwdriver 90 is inserted between the pair of projection portions 66.

Moreover, a flat portion 66C that extends out in a direction orthogonal to the insertion direction of the flat head screwdriver 90 is formed to each of the projection portions 66 on the opposite side to the insertion opening 64A. The leading end portion 90A of the flat head screwdriver 90 accordingly catches on the flat portion 66C of each of the projection portions 66 when the leading end portion 90A is withdrawn from between the pair of projection portions 66, rendering it difficult for the leading end portion 90A of the flat head screwdriver 90 to be pulled out from between the pair of projection portions 66.

An engaging portion 68 is furthermore provided on the opposite side of the second grip tab 62B to the first grip tab 62A. An engaged portion 48 is also provided to an inside wall portion 46 of the opening 40, disposed at the opening 40 inner side with respect to the engaging portion 68. Consequently, when the second grip tab 62B is resiliently deformed in the direction to move away from the first grip tab 62A, the engaging portion 68 accordingly engages with the engaged portion 48 in the flat head screwdriver 90 insertion direction in a configuration in which displacement of the second grip tab 62B towards the opening 40 inner side is restricted.

Figure 8:
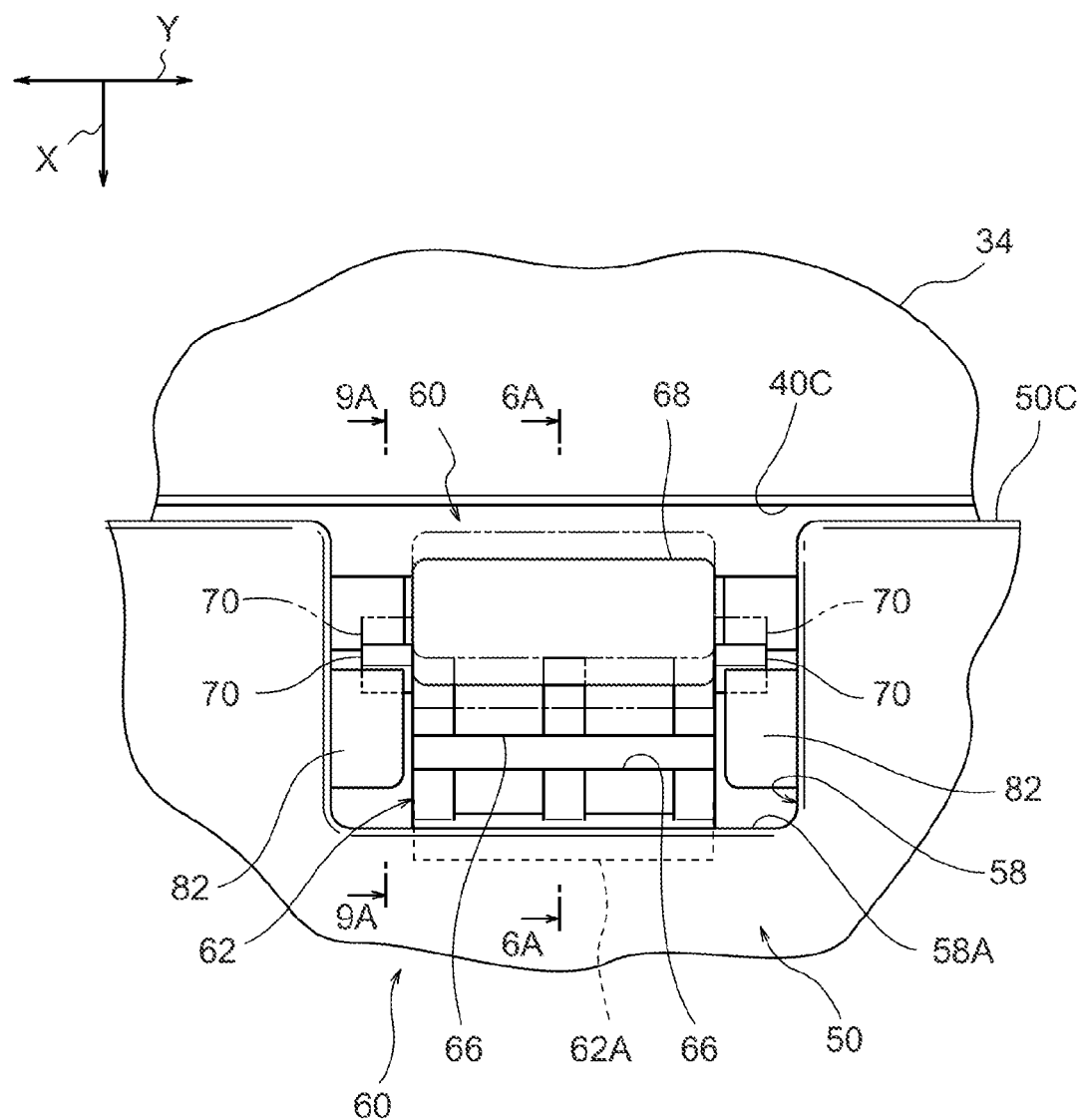
FIG. 8 is an enlarged view of a portion of FIG. 2, illustrating a claw configuring a lock mechanism.

As illustrated in FIG. 5 and FIG. 8, claw portions 70 serving as examples of anchor portions are respectively provided on the two width direction sides of the second grip tab 62B. A pair of restriction wall portions 80 is provided at positions facing towards the claw portions 70 as an example of a pair of restriction portions on the opening bottom section 40L.

Figure 9A:
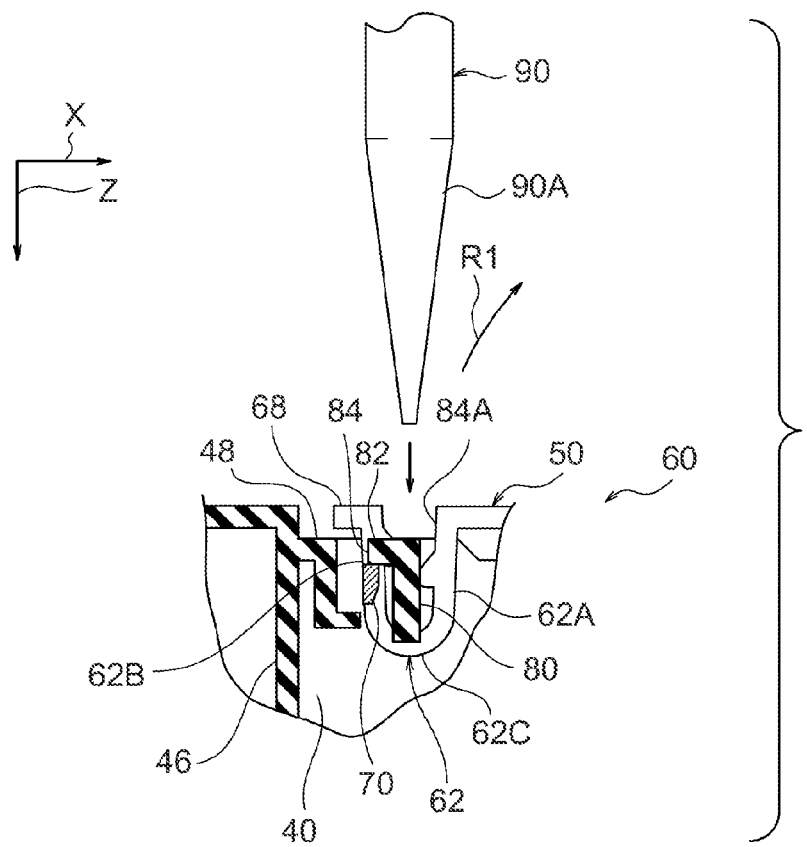
FIG. 9A is a cross-section taken on ling 9A-9A of FIG. 8.

The pair of restriction wall portions 80 are, as illustrated in FIG. 9A, disposed with respect to the claw portions 70 so as to be on the first grip tab 62A side in an anchored state of the claw portions 70 to engaged portions 82, described later. Thus when the second grip tab 62B attempts to resiliently deform in the direction to approach the first grip tab 62A, the claw portions 70 make contact with the restriction wall portions 80, in a configuration that restricts resilient deformation of the second grip tab 62B.

The engaged portions 82 are provided to each of the restriction wall portions 80 so as to extend out from the restriction wall portions 80 towards the opposite side to the first grip tab 62A. The engaged portions 82 are disposed on the memory cover 50 opening direction (the arrow R1 direction) side with respect to the claw portions 70. The claw portions 70 are accordingly anchored by the engaged portions 82 when the memory cover 50 attempts to pivot in the opening direction. Pivoting of the memory cover 50 in the opening direction is thereby restricted, and in a configuration that holds the memory cover 50 in a state positioned in the closed position.

Figure 9B:
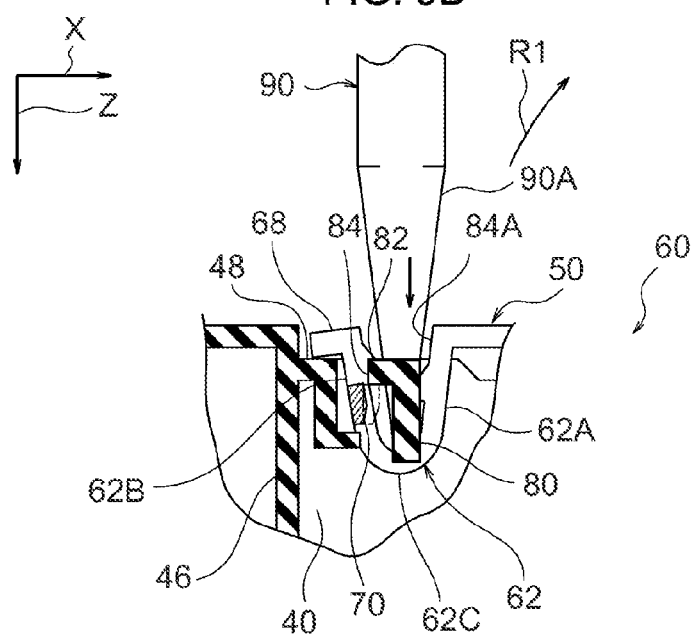
FIG. 9B is a cross-section corresponding to FIG. 9A and illustrating a deformed state of a second grip tab.

However, as illustrated in FIG. 9B, when the leading end portion 90A of the flat head screwdriver 90 is inserted into the insertion groove 64, the claw portions 70 are moved in the direction to move away from the first grip tab 62A accompanying resilient deformation of the second grip tab 62B. More specifically, the claw portions 70 move from an anchored state anchored to the engaged portions 82 (the position illustrated in FIG. 9A) towards a released position (the position illustrated in FIG. 9B) in which the anchored state to the engaged portions 82 is released. The anchored state of the claw portions 70 to the engaged portions 82 is thereby released. Movement of the claw portions 70 to the released position enables the claw portions 70 to move through an attachment-detachment opening 84 formed between the engaged portions 82 and the engaged portion 48, towards the memory cover 50 opening direction.

Explanation next follows regarding operation of the present exemplary embodiment.

FIG. 9A illustrates a state in which the claw portions 70 of the lock mechanism 60 are anchored in the memory cover 50 opening direction by the engaged portions 82 of the fixed side casing 30, and the memory cover 50 is held in the closed position in the opening 40. In order to open the memory cover 50 from this state, as illustrated in FIG. 6A and FIG. 6B, the leading end portion 90A of the flat head screwdriver 90 is inserted into the insertion groove 64 formed in the grip portion 62 of the lock mechanism 60. The leading end portion 90A of the flat head screwdriver 90 is thereby gripped between the pair of projection portions 66 that project out towards the insertion groove 64 respectively from the first grip tab 62A and the second grip tab 62B, and the second grip tab 62B is resiliently deformed in the direction to move away from the first grip tab 62A (the arrow T direction). Accompanying resilient deformation of the second grip tab 62B, as illustrated in FIG. 9B, the claw portions 70 move in the direction to move away from the first grip tab 62A. Namely, the claw portions 70 move from the anchor position anchored to the engaged portions 82 towards the released position in which the anchored state to the engaged portions 82 is released. The anchored state of the claw portions 70 to the engaged portions 82 is thereby released, enabling the claw portions 70 to move through the attachment-detachment opening 84 towards the memory cover 50 opening direction.

In this state, an operator catches the catching groove 56 of the memory cover 50, for example with a finger, and, as illustrated by the double dot broken lines in FIG. 4, the flat head screwdriver 90 with its leading end portion 90A gripped by the grip portion 62 is pulled up towards the memory cover 50 opening direction (the arrow R1 direction). The memory cover 50 is thereby pivoted in the opening direction about the opening portion 40A that is hooked into by the pair of hook portions 52, and the memory cover 50 opened.

In order to close the memory cover 50, in a state in which the leading end portion 90A of the flat head screwdriver 90 has been withdrawn from the grip portion 62, the memory cover 50 is pivoted towards the closed direction (the arrow R2 direction) about the opening portion 40A hooked into by the pair of hook portions 52. Sloping faces 70A (see FIG. 5) formed to the claw portions 70 of the lock mechanism 60 then press against edge portions of the attachment-detachment opening 84, and the claw portions 70 are inserted into the attachment-detachment opening 84 as the second grip tab 62B is resiliently deformed in the direction to move away from the first grip tab 62A. After the claw portions 70 have been inserted into the attachment-detachment opening 84, the second grip tab 62B rebounds in the direction to approach the first grip tab 62A. The claw portions 70 move from the released position towards the anchored position accompanying the rebound of the second grip tab 62B, and the claw portions 70 are anchored with respect to the engaged portions 82. The memory cover 50 is accordingly held in a state positioned in the closed position.

Thus in the present exemplary embodiment, the claw portions 70 are moved from the anchored position, in which they are anchored to the engaged portions 82, to the released position, in which the anchored state to the engaged portions 82 is released, by inserting the leading end portion 90A of the flat head screwdriver 90 into the insertion groove 64. In this state the leading end portion 90A of the flat head screwdriver 90 is gripped between the pair of the first grip tab 62A and the second grip tab 62B. The memory cover 50 can accordingly be opened by pulling the flat head screwdriver 90 upwards towards the memory cover 50 opening direction. The effort of the opening operation of the memory cover 50 is accordingly reduced.

Moreover, as illustrated in FIG. 7, the projection portions 66 are respectively provided to the first grip tab 62A and the second grip tab 62B. The gripping force on the leading end portion 90A is increased by the leading end portion 90A of the flat head screwdriver 90 being gripped by the projection portions 66.

Moreover, the sloping portion 66B is formed to each of the projection portions 66 on the insertion opening 64A side of the insertion groove 64, so as to slope towards the opposite side to the insertion opening 64A (towards the opening bottom section 40L side) on progression towards the projection direction leading end portion 66A side. The leading end portion 90A of the flat head screwdriver 90 can thus be inserted into the insertion groove 64, and the leading end portion 90A of the flat head screwdriver 90 is guided along the sloping portions 66B of the respective projection portions 66 between the pair of leading end portions 66A of the projection portions 66. The leading end portion 90A of the flat head screwdriver 90 can accordingly be inserted easily between the pair of projection portions 66.

Furthermore, one of the projection portions 66 that projects out from the second grip tab 62B is positioned with respect to the other of the projection portions 66 that projects out from the first grip tab 62A on the insertion opening 64A side of the insertion groove 64. A larger moment accordingly acts on the second grip tab 62B than on the first grip tab 62A when the leading end portion 90A of the flat head screwdriver 90 is inserted between the pair of projection portions 66. The second grip tab 62B is accordingly readily resiliently deformed in the direction to move away from the first grip tab 62A, and the insertion force to insert the leading end portion 90A of the flat head screwdriver 90 between the pair of projection portions 66 is reduced. The effort of the opening operation of the memory cover 50 is accordingly reduced even further.

The flat portions 66C are formed respectively to each of the projection portions 66 on the opposite side to the insertion opening 64A, so as to extend in a direction orthogonal to the flat head screwdriver 90 insertion direction. The leading end portion 90A of the flat head screwdriver 90 accordingly readily catches on each of the flat portions 66C of each of the projection portions 66 when the flat head screwdriver 90, whose leading end portion 90A has been inserted between the pair of projection portions 66, is pulled up in the memory cover 50 opening direction. The leading end portion 90A of the flat head screwdriver 90 is accordingly suppressed from coming out from the between the pair of projection portions 66 when the memory cover 50 is pulled up in the opening direction by the flat head screwdriver 90.

Moreover, in the present exemplary embodiment, the anchored state of the claw portions 70 with respect to the engaged portions 82 is released by causing the second grip tab 62B to resiliently deform with respect to the first grip tab 62A towards the opposite side to the memory cover 50 opening direction. Namely, in the present exemplary embodiment, when opening the memory cover 50, the deformation direction of the second grip tab 62B is the opposite direction to the memory cover 50 opening direction. It is accordingly difficult to resiliently deform the second grip tab 62B with the finger of an operator, and then, in a state in which the anchored state of the claw portions 70 with respect to the engaged portions 82 is released, to pivot the memory cover 50 in the opening direction.

Consequently, it is difficult to open the memory cover 50 unless a specific tool (insertion member) such as the flat head screwdriver 90 is employed. Consequently, problems such as the theft of the memory card 38 housed in the opening 40 can be prevented.

Moreover, the restriction wall portions 80 are provided to the opening bottom section 40L so as to be disposed on the first grip tab 62A side with respect to the claw portions 70 positioned in the anchored position. The claw portions 70 accordingly make contact with the restriction wall portions 80 when for example an operator attempts, such as with their finger, to deform the second grip tab 62B in the direction to approach the first grip tab 62A. Resilient deformation of the second grip tab 62B in the direction to approach the first grip tab 62A is accordingly restricted. Release of the anchored state of the claw portions 70 with respect to the engaged portions 82 can accordingly be suppressed.

Moreover, the engaging portion 68 is provided to the second grip tab 62B projecting out towards the opposite side to the first grip tab 62A. The engaged portion 48 is also provided to the inside wall portion 46 of the opening 40 so as to be disposed on the opening 40 inner side with respect to the engaging portion 68. Thus when the leading end portion 90A of the flat head screwdriver 90 is inserted into the insertion groove 64 and the second grip tab 62B has been resiliently deformed, the engaging portion 68 engages with the engaged portion 48 in the flat head screwdriver 90 insertion direction, restricting displacement of the second grip tab 62B towards the opening 40 inner side. Hence problems such as damage to the grip portion 62 are suppressed.

Moreover, in the present exemplary embodiment, the memory cover 50 is maintained in the closed position by the claw portions 70 being anchored to the engaged portions 82. The number of components can accordingly be reduced in comparison to cases in which the memory cover 50 is fixed to the lower case 34 by for example bolts or screws.

Explanation follows regarding modified examples of the above exemplary embodiment.

In the above exemplary embodiment an example is illustrated in which the projection portions 66 are respectively provided to the first grip tab 62A and the second grip tab 62B, however a projection portion 66 may be provided to only one of the first grip tab 62A or the second grip tab 62B. Moreover, the projection portions 66 may be provided to the first grip tab 62A, or to the second grip tab 62B, or to the first grip tab 62A and the second grip tab 62B, and configuration may be made in which the projection portions 66 are omitted as appropriate.

Moreover, in the above exemplary embodiment an example is illustrated in which the grip portion 62 is formed with a U-shaped cross-section, however the shape of the grip portion 62 may be modified as appropriate. Moreover, the shape, placement and number of portions, such as the claw portions 70, the engaged portions 82 and the restriction wall portions 80 illustrated in the above exemplary embodiment, may be modified as appropriate. Similarly, the shape, placement and number of portions, such as the engaging portion 68 and the engaged portion 48 illustrated in the above exemplary embodiment, may be modified as appropriate. Note that the restriction wall portions 80, the engaging portion 68 and the engaged portion 48 may be provided as appropriate, and configuration may be made in which they are omitted as appropriate.

Moreover, although in the above exemplary embodiment an example is illustrated in which the second grip tab 62B is disposed on the opposite side to the opening portion 40A that is the pivot axis of the memory cover 50 with respect to first grip tab 62A, there is no limitation thereto. For example, the second grip tab 62B may be placed on the opening portion 40A side with respect to the first grip tab 62A.

Moreover, although in the above exemplary embodiment an example is illustrated in which the lock mechanism 60 is provided to the other end portion 50C of the memory cover 50, there is no limitation thereto. For example, the lock mechanism 60 may be provided to the case width direction end portions 50B of the memory cover 50.

Moreover, although in the above exemplary embodiment the first end portion 50A of the memory cover 50 is detachably attached to the opening portion 40A of the opening 40, there is no limitation thereto. For example, the first end portion 50A of the memory cover 50 may be non-detachably attached to the opening portion 40A of the opening 40 through for example a hinge.

Moreover, although in the above exemplary embodiment, explanation has been given of an example in which the memory cover 50 serves as a cover, there is no limitation thereto. For example, the cover may be configured as the radiator fin cover 26, or may be configured as a hard disk cover attached to an opening employed for a hard disk drive, serving as an example of a storage device, so as to be capable of opening and closing.

Moreover, in the above exemplary embodiment, explanation has been given of an example in which the flat head screwdriver 90 serves as the insertion member, however there is no limitation thereto. The insertion member may, for example, by be configured by any member capable of being inserted into the insertion groove 64 of the lock mechanism 60 to release the anchored state between the claw portions 70 and the engaged portions 82. Moreover, the insertion member is not limited to a general purpose implement such as the flat head screwdriver 90, and a dedicated implement with a shape corresponding to the shape of the grip portion 62 may be employed.

Moreover, in the above exemplary embodiment, explanation has been given of an example in which the notebook PC 10 serves as an example of an electronic device, however the above exemplary embodiment is also applicable for example to an electronic device such as a DVD player or electronic dictionary.

Moreover, although the technology disclosed herein has been explained in relation to an exemplary embodiment, the technology disclosed herein is not limited by the above exemplary embodiment. Moreover, appropriate combinations may be made of elements of the exemplary embodiment and the modified examples, and obviously various embodiments may be implemented within a range not departing from the spirit of the technology disclosed herein.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A case comprising:
   a casing body formed with an opening;
   a cover attached to the opening so as to be capable of opening and closing;
   a first grip tab that extends out from the cover towards an inner side of the opening; and
   a second grip tab that includes an anchor portion that anchors in the cover opening direction to an anchored-to portion provided to the casing body, the second grip tab disposed facing towards the first grip tab and resiliently supported by the first grip tab so as to be capable of approaching towards and moving away from the first grip tab such that an insertion portion, opened in the opening direction of the opening, is formed between the first grip tab and the second grip tab, and tab when an insertion member has been inserted into the insertion portion, the second grip tab moves away from the first grip tab, releases an anchored state of the anchor portion to the anchored-to portion, and grips the insertion member between the second grip tab and the first grip tab.

2. The case of claim 1, wherein the second grip tab is disposed on the opposite side of the first grip tab to the cover opening direction.

3. The case of claim 1, wherein a restriction portion is provided to the casing body and the restriction portion is disposed on the first grip tab side of the anchor portion in a state in which the anchor portion is anchored to the anchored-to portion.

4. The case of claim 1, wherein:
   a first end portion of the cover is attached to the opening so as to enable opening and closing about a pivot axis running along the first end portion;
   the first grip tab is provided at another end side of the cover; and
   the second grip tab is disposed with respect to the first grip tab on the opposite side to the pivot axis.

5. A case comprising:
   a casing body formed with an opening;
   a cover attached to the opening so as to be capable of opening and closing;
   a first grip tab that extends out from the cover towards an inner side of the opening;
   a second grip tab that includes an anchor portion that anchors in the cover opening direction to an anchored-to portion provided to the casing body, the second grip tab disposed facing towards the first grip tab and resiliently supported by the first grip tab so as to be capable of approaching towards and moving away from the first grip tab such that an insertion portion, opened in the opening direction of the opening, is formed between the first grip tab and the second grip tab and such that an anchored state of the anchor portion to the anchored-to portion is released by the second grip tab moving away from the first grip tab; and
   a pair of projection portions that project out into the insertion portion are respectively provided to the first grip tab and the second grip tab.

6. The case of claim 5, wherein one of the projection portions that projects out from the second grip tab is positioned with respect to the other of the projection portions that projects out from the first grip tab on an insertion opening side of the insertion portion.

7. The case of claim 5, wherein sloping portions are respectively formed on the insertion opening side of the pair of projection portions so as to slope towards the opposite side to the insertion opening on progression towards projection direction a leading end portions.

8. A case comprising:
   a casing body formed with an opening;
   a cover attached to the opening so as to be capable of opening and closing;
   a first grip tab that extends out from the cover towards an inner side of the opening;
   a second grip tab that includes an anchor portion that anchors in the cover opening direction to an anchored-to portion provided to the casing body, the second grip tab disposed facing towards the first grip tab and resiliently supported by the first grip tab so as to be capable of approaching towards and moving away from the first grip tab such that an insertion portion, opened in the opening direction of the opening, is formed between the first grip tab and the second grip tab and such that an anchored state of the anchor portion to the anchored-to portion is released by the second grip tab moving away from the first grip tab;
   an engaging portion is provided to the second grip tab so as to project out towards the opposite side to the first grip tab; and
   an engaged portion is provided to the casing body and disposed with respect to the engaging portion on the opening inner side.

9. The case of claim 1, wherein the second grip tab is resiliently supported by the first grip tab through a bottom wall portion of the insertion portion.

10. The case of claim 9, wherein the first grip tab, the second grip tab and the bottom wall portion together configure a U-shaped cross-section.

11. The case of claim 1, wherein the cover is detachably attached to the opening.

12. The case of claim 1, wherein the insertion member is a flat head screwdriver.

13. An electronic device comprising:
   an electronic component; and
   the case of claim 1 that houses the electronic component.

14. The electronic device of claim 13, wherein the electronic component is housed in the casing body through the opening.

15. The electronic device of claim 13, wherein the electronic component is a storage device.

* * * * *